United States Patent [19]

Usui

[11] 3,808,751

[45] May 7, 1974

[54] METHOD OF MAKING A SANDBLAST MASK

[75] Inventor: Setsuo Usui, Kanagawa-ken, Japan

[73] Assignee: Sony Corporation, Tokyo, Japan

[22] Filed: Feb. 18, 1972

[21] Appl. No.: 227,444

[30] Foreign Application Priority Data

Feb. 20, 1971 Japan .................................. 46-8230

[52] U.S. Cl. ...................... 51/312, 96/36.2, 96/84 R

[51] Int. Cl. ............................................. E06b 7/20

[58] Field of Search .................. 96/84 R, 35.1, 36.2; 51/312

[56] References Cited

UNITED STATES PATENTS

| | | | |
|---|---|---|---|
| 2,544,905 | 3/1951 | Van Deusen | 96/35.1 |
| 2,604,388 | 7/1952 | Staehle | 96/35.1 |
| 3,186,844 | 6/1965 | Alles et al. | 96/35.1 |
| 3,079,254 | 2/1963 | Rowe | 96/36.2 |
| 3,240,601 | 3/1966 | Stalnecker et al. | 96/36.2 |
| 3,265,542 | 8/1966 | Hirshon | 96/36.2 |
| 3,415,648 | 10/1968 | Certa | 96/36.2 |

OTHER PUBLICATIONS

Oliver, Def. Pub. Search Copy of S.N. 571,633, filed 8/10/66. pub. in 856 OG 1019, on 11/26/68. Def. Pub. No. T856,040.

*Primary Examiner*—David Klein
*Attorney, Agent, or Firm*—Lewis H. Eslinger, Esq.; Alvin Sinderbrand, Esq.

[57] ABSTRACT

A method of making a sandblast mask from a photopolymer layer including the step of forming a colored filter layer between the photopolymer layer and the workpiece to prevent light reflected from the workpiece from exposing the photopolymer layer.

8 Claims, 20 Drawing Figures

METHOD OF MAKING A SANDBLAST MASK

BACKGROUND OF THE INVENTION

1. Field of the Invention

This invention relates to a method of making a sandblast mask and more particularly it relates to an improved method of making a sandblast mask having a pattern with high resolution.

2. Description of the Prior Art

The processing of semiconductors, metals or insulated materials by slitting, separation or the like has heretofore been effected by chemical etching, electrochemical etching, discharge etching, or laser etching. Chemical etching is especially popular in mass production, however, the use of chemical etching makes it impossible to process a carbon or any material having many boundaries such as a polycrystalline semiconductor. In some cases the photosensitive materials have no endurance for a particular chemical etchant. Another problem is that in chemical etching the etching depth may not be made larger than its width. Thus, for example, cutting of a thick semiconductor wafer into pellets requires a complex operation that makes the etched surface non-uniform. The wafer is removed unevenly and the etching is effected from both sides of the wafer.

In such cases sandblasting is more convenient than chemical etching. The mask for sandblasting must be thick, for example from 50 microns to as much as 100 microns and more, as compared with the thickness of the etching mask. When this mask layer is formed by a photosensitive material such as a photopolymer which is exposed to light under a photomask and developed by a prior art method, this layer has the disadvantage that the pattern imposed on the photosensitive layer deteriorates in resolution. The reason this phenomena occurs is that incident light is reflected and scattered from the surface of the substrate beneath the photosensitive layer back into the photosensitive layer, resulting in exposure of portions which were not to be exposed.

SUMMARY OF THE INVENTION

A method of forming a mask for the selective sandblasting of a substrate comprising the steps of providing a thin filter layer on the surface of the substrate to absorb light reflected from the substrate, forming a photosensitive layer of a photopolymer upon the thin filter layer, and exposing select portions of the photosensitive layer to a light source. The filter layer is chosen to easily adhere to the workpiece. It is also chosen to be easily removable by a solvent or by heating. In the alternative the filter layer is chosen to be thin, for example, 100 microns or less so that it may be mechanically removed as by sandblasting. In one preferred embodiment the filter layer is colored red.

DESCRIPTION OF THE PREFERRED EMBODIMENTS

Figure 1:
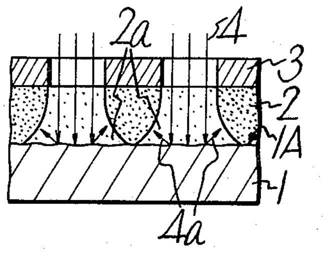
Fig. 1 PRIOR ART
FIG. 1 is a sectional view of one example of a prior art method of making a sandblast mask.

With reference now to FIG. 1, in some prior art methods a sandblast mask is formed upon a surface 1A of a gallium phosphide substrate 1 by applying a 200 microns thick photosensitive layer 2 over the substrate surface and covering the photosensitive layer 2 with a photomask 3. The photosensitive layer 2 is exposed to light 4 through cutouts in the photomask 3. Light which is reflected and scattered by the surface 1A of the substrate 1 exposes photosensitive areas 2*a* which should not be exposed. Therefore, a narrower width sandblast mask is formed near its lower surface after development. Adhesion of the sandblast mask 2 to the substrate 1 deteriorates because of this narrowing. By way of example, the pattern error for an exposed sandblast mask having a 120 micron thick photosensitive layer is on the order of about 50 microns. Therefore, the prior art method makes it difficult to form a sandblast mask pattern from a photosensitive layer which is 100 microns or less in thickness.

Figure 2:
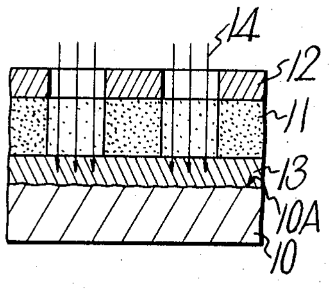
FIGS. 2 through 4 are vertical sectional views illustrating the method of forming a sandblast mask according to the invention.
Figure 3:
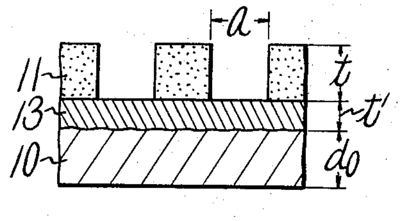
Figure 4:
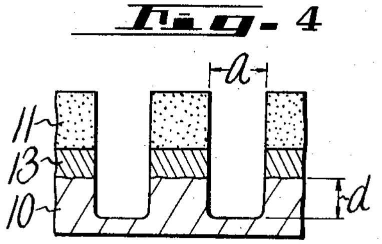

Referring now to FIGS. 2 through 4, the basic method of forming a sandblast mask according to the invention will be explained. A filter layer 13 is sandwiched between a workpiece 10 and a photopolymer or photosensitive layer 11. This filter layer 13 is opaque or absorptive for light having a wavelength to which the layer 11 is sensitive. It transmits light of other wavelengths. Because of the nature of the filter layer 13, light 14 is completely absorbed into the filter layer 13 before it reaches the surface of the workpiece, with result that the photosensitive layer 11 never deteriorates in resolution due to light reflected from the workpiece surface. Even though the photosensitive layer 11 is extremely thick, exposure can be accurately made according to the pattern of the mask 12.

In FIG. 3, if the thicknesses of the photosensitve layer 11, the workpiece 10 and the filter layer 13 are expressed by $t$, $d_0$ and $t'$ respectively, and the minimum working width is expressed by a, then the method of forming the sandblast mask according to this invention is especially useful in the case of a $\leq$ $t$. A preferred film layer is one in which the thickness of the filter layer 13 is in the order of $t' \leq (1/10)t$. Other requirements for the filter layer 13 are that it have a good adhesion to both the workpiece 10 and the photosensitive layer 11 and that, after exposure and development of the photosensitive layer, the exposed portions of the filter layers 13 can be easily removed at the time of sandblasting. When it is desired to remove the filter layer 13 it is chosen to be dissolvable by a solvent, to be removable by heating, or to be easily mechanically removed.

In the case of $a = 50\mu$, $t = 50\mu$, and $t' = 2\mu$, the filter layer 13 is preferably formed by applying a dye added to a resin such as an acrylate, polystyrene, or polycarbonate resin, onto the workpiece by dipping or by rotary application. The layer may be easily removed from the workpiece by a solvent such as methyl-ethyl ketone, acetone or the like. Moreover a thinner filter layer may be made by deposition of an organic dye.

At the time of sandblasting, the minimum working width a is limited to be on the order of ten times the sand grain size, while the working depth is much deeper as compared with that of the chemical etching method. As illustrated in FIG. 4, if the working depth is expressed by $d$, then sandblast etching is possible in the order of $d = 5a$. Therefore a crystal wafer may be efficiently cut into pellets when the method according to this invention is utilized.

Figures 5A, 5B, 5C, 5D, 5E, 5F, 5G, 5H:
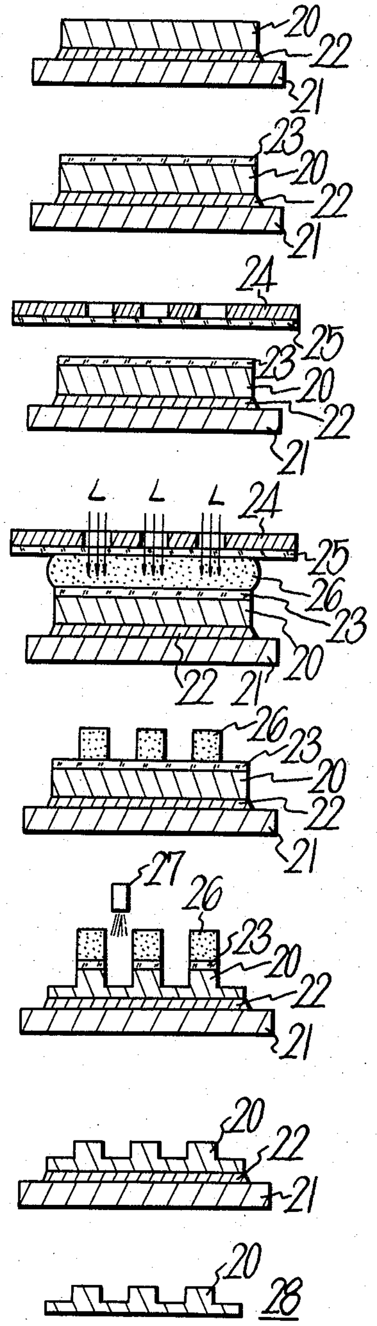
FIGS. 5A through 5H are vertical sectional views sequentially illustrating a sandblasting process using the method of forming a sandblast mask according to the invention.

Referring now more particularly to FIGS. 5A-5H one example of the method of forming a sandblast mask according to this invention is illustrated. In FIG. 5A a workpiece 20 with polished and cleaned surfaces is fastened to a base 21 which may be either metallic or nonmetallic. The workpiece 20 is fastened to the base 21 by an adhesive 22 made of parafine, a resin or the like. When it is necessary that an electrical connection be made to the base 21, adhesion of the workpiece 20 to the base 21 may be effected by solder, die bonding or the like.

A filter layer 23 is next formed on the workpiece 20. The filter layer 23 is preferably formed by dipping the processed workpiece 20 into a thermo-setting epoxy resin, such as is available under the tradename of Stycast for example, which is colored red by a dye (FIG. 5B). A preferable material for the photopolymer or photosensitive layer 26 which is thereafter formed on the filter layer 23 is one which may be applied with a thickness of $50\mu$ or more which is required for the sandblast mask and which has a Shore hardness of 50° to 80° after photopolymerization.

Examples of such preferable materials are photosensitive resins, available under the tradenames of Sonne KPM 1018 and Sonne KPM 1027 which are manufactured by Kansai Paints Co. of Japan, or a polyvinyl alcohol layer containing a photosensitive material such as ammonium dichromate. The Sonne KPM 1018 and Sonne KPM 1027 are polyurethane copolymers in which a volatile material is not included. They are liquid photosensitive resins which cure themselves due to free radical polymerization caused by ultraviolet light in the wavelength range of 300 to 400 $m\mu$. They are effective to form a thick layer having an accurate pattern because there is little volume contraction in curing. In the remainder of this description in reference to FIGS. 5A-5H it will be understood that Sonne KPM 1027 is used as the photosensitive resin.

As shown in FIG. 5C, an exposure mask 24 having a desired cutout pattern is prepared and a thin protective film 25 is glued to the surface of the exposure mask 24 which faces the filter layer 23. The protective film 25 is formed by depositing a silicone resin layer, or a layer of polyvinylidene chloride (available under the tradenames of Saran Wrap or Kre Wrap) on the exposure mask 24 under pressure. This prevents the photosensitive resin from adhering to the exposure mask 24 in curing.

The surface of the workpiece 20 which is covered with the filter layer 23 is spaced apart from the surface of the mask 24 which is covered with the protection film 25 by an amount which corresponds to the desired thickness of the photosensitive resin layer 26. The liquid photosensitive resin 26 is then poured between the filter layer 23 and the protective film covered exposure mask 24. The photosensitive resin layer 26 is exposed through the cutout portions of the mask 24 to the light L of a mercury lamp. The light which passes through the exposure mask 24 and the photosensitive layer 26 is absorbed by the filter layer 23, with the result that it does not reach the surface of the workpiece 20. Therefore, because there is no reflection or scatter of the light from the workpiece surface to the photosensitive layer 26, precise exposure of the photosensitive layer 26 can be effected according to the pattern of the exposure mask 24.

The exposure mask 24 is next stripped from the photosensitive layer 26 along with the protective film 25 and the stripped photosensitive layer 26 is developed by a mixed liquid of water and ethyl alcohol. At this time, when the photosensitive layer 26 is thick, brushing or liquid spray is needed to remove the portions of the photosensitive layer 26 which were not exposed to light and thus were not cured. It is not sufficient to only immerse the layer 26 into a developer. It is preferable after development that the entire surface be exposed to the light to obtain a good adhesion between the filter layer 23 and the photosensitive layer 26. Thus as shown in FIG. 5E, the developed photosensitive layer 26 has a pattern substantially identical to that of the exposure mask 24. It also has elasticity and a Shore hardness of about 78°. The layer 26 is now ready to serve as a sandblast mask.

When a sandblast nozzle 27 is moved over the entire surface so that the stream of sand grains strikes only the exposed portions of the workpiece 20 through the photosensitive layer 26 as a sandblast mask, the workpiece can be uniformally and efficiently removed along with the filter layer 23 (FIG. 5F). After the sandblasting, the photosensitive layer 26 and the filter layer 23 may be removed from the workpiece 20 by sticking an adhesive tape to them and peeling them away. They may also be heated to a high temperature to carbonize them. The workpiece 20 is thereafter removed from the base 21 as shown in FIG. 5H so that the desired object 28 having fine grooves is obtained.

Figure 6A:
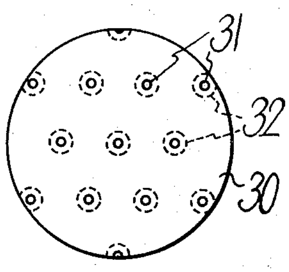
FIG. 6A is a plan view of a semiconductor wafer.
Figure 6B:
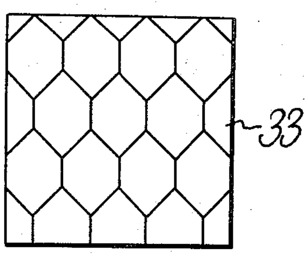
FIG. 6B is a plan view of an exposure mask having hexagonal patterns.
Figures 6C, 6D, 6E:
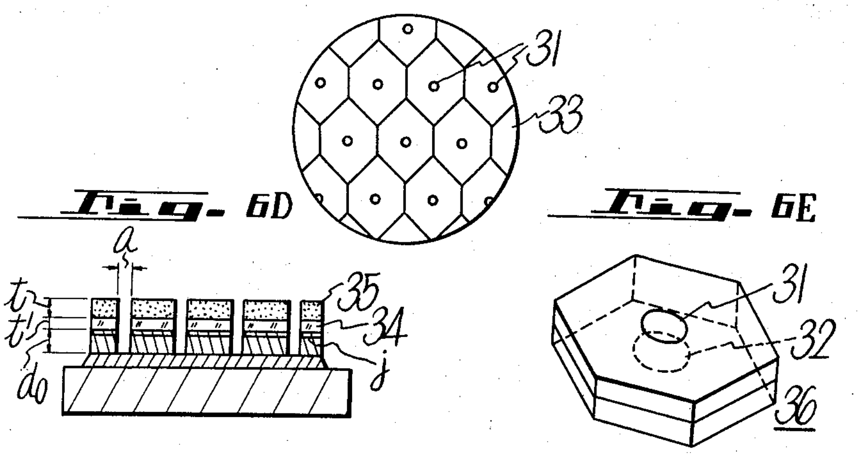
FIG. 6C is a horizontal view taken above the exposure mask of FIG. 6B after it is positioned over the semiconductor wafer of FIG. 6A.
FIG. 6D is a vertical sectional view of the wafer and the sandblast mask as finally formed by the method of the invention.
FIG. 6E is a perspective view of a hexagonal light emitting diode pellet cut from the semiconductor wafer of FIG. 6A by sandblasting through the mask of FIG. 6D.

In FIGS. 6A-6E a process utilizing this invention for pelletizing a semiconductor wafer into hexagonal light emitting diodes is shown. A GaP semiconductor wafer 30 having a junction $j$ and an exposure mask 33 having hexagonal patterns are first prepared (FIGS. 6A and B). Electrode patterns 31 and 32 are next deposited upon the surfaces of the wafer as shown in FIG. 6A. A filter layer 34 (FIG. 6C) consisting of a red colored plastic material (available under the tradename of Plastop XC 20) is formed on the semiconductor wafer 30 in a manner similar to the step discussed in reference to FIG. 5B. The exposure mask 33 is thereafter positioned relative to the electrode patterns 31 and 32 such that they are each aligned substantially at the center of one of the hexagonal patterns of the exposure mask 33 (FIG. 6C).

A photosensitive resin, such as Sonne KPM 1027, is then poured between the wafer 30 and the exposure mask 33. This forms a photosensitive layer 35 having hexagonal patterns after exposure to a light source and development in a manner similar to the steps discussed above in reference to FIGS. 5D and 5E. Thereafter the exposed portions of the semiconductor wafer 30 are removed throughout the thickness of the wafer by sandblasting through the mask formed from the layer 35 (FIG. 6D). Thus, a precisely hexagonal light emitting diode pellet 36 can be easily obtained by sandblasting as shown in FIG. 6E.

In one specific example of the above process the thickness $t$ of the photosensitive resin layer 35 was $100\mu$, and the thickness $t'$ of the filter layer 34 was $2\mu$. The photosensitive resin layer 35 was exposed for 15 seconds to a mercury lamp having an intensity of 1,000 luxes. A nozzle having a diameter of 0.2mm, with an air pressure of $4kg/cm^2$ and a sand grain size of 600 mesh was moved over the workpiece at a height of about 5mm and at a rate of one scan per second in the horizontal direction and one scan per minute in the vertical direction. The GaP wafer had an area of 1 square inch and a thickness of about $d_0 = 250\mu$ and was cut completely through in 10 minutes. The working surface was substantially plain and the working error of the upper surface and the bottom surface was negligible. When sandblasting was used on a similarly dimensioned GaP wafer without using the filter layer 34 and under the same conditions as abovedescribed, the working error was about $70\mu$.

Figure 7A:
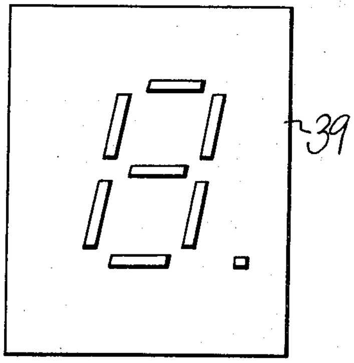
FIG. 7A is a plan view of an exposure mask for forming a numeral sandblast mask according to the invention.
Figure 7B:
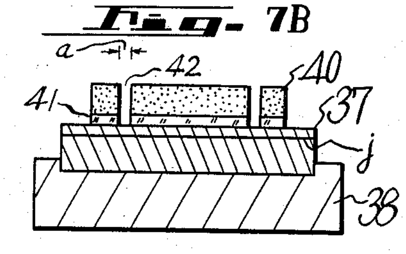
FIGS. 7B and 7C are vertical sectional views illustrating the process of making a monolithic numeral display element by sandblasting through a mask made according to the invention.
Figure 7C:
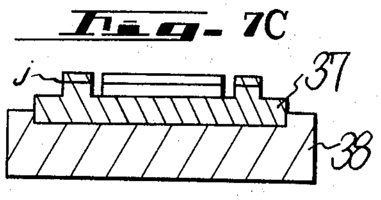

FIG. 7 illustrates an example wherein a monolithic numeral display element is formed by sandblasting through a mask made according to the method of the invention. In this case, a GaP wafer 37 of suitable size and having a junction $j$ is secured to a metallic plate 38, such as Koval or the like by die bonding. A filter layer 41 is applied to the upper surface of the wafer 37. An exposure mask 39 having cutout portions in the pattern of the numeral eight is prepared. A photosensitive layer 40 carrying the eight figure pattern is thereafter formed on the wafer 37 by the steps described above in reference to FIGS. 5A-5E (FIGS. 7B and 7C).

Since light (for example red) from a junction of a light emitting diode can pass through the crystal, light from one diode segment penetrates into other diode segments result in distortion of optical isolation. Therefore, the depth of the slot 42 between two adjacent segments of the wafer 37 must be much deeper as compared with its width a. For example, when the depth of a PN junction j formed in the wafer is $100\mu$ from the surface thereof, and the figure is 2.0 × 2.5 mm in size, each of the segments should be 0.3 × 1.2 mm in size and the space between two adjacent segments should be on the order of 0.1 mm. The thickness of the wafer used should be on the order of $200\mu$ to $250\mu$ and further the working depth should be $200\mu$.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

I claim as my invention:

1. A method of making a mask for the selective sandblasting of a substrate comprising the steps of forming a light absorbing filter layer on the substrate, forming on the filter layer a layer of material which is photosensitive and which polymerizes when exposed to light, the filter layer having a thickness which is no greater than one tenth the thickness of the photosensitive layer and absorbing at least light to which the photosensitive layer is sensitive, exposing the photosensitive layer to a source of light through a photomask having a predetermined pattern of apertures whose minimum dimensions are no greater than the thickness of the photosensitive layer and at least equal to one fifth the depth to which the substrate is to be sandblasted, and thereafter developing the photosensitive layer to remove portions thereof which were unexposed to the light.

2. A method of making a mask for the selective sandblasting of a substrate as recited in claim 1 comprising the further step of removing the filter layer with a solvent after developing the photosensitive layer.

3. A method of making a mask for the selective sandblasting of a substrate as recited in claim 1 wherein the photosensitive layer is formed to have a thickness of at least 50 microns.

4. A method of making a mask for the selective sandblasting of a substrate as recited in claim 1 wherein the photosensitive layer is formed to have a Shore hardness of between 50° to 80°.

5. A method of processing a wafer comprising the steps of forming a colored layer on the wafer, forming a photopolymer layer on the colored layer, exposing the photopolymer layer to a source of light through a photomask having a predetermined pattern of light-transmitting areas the minimum dimension of which is no greater than the thickness of said photosensitive layer and at least equal to one fifth the depth to which the substrate is to be sandblasted, the colored layer including a material which absorbs light to which the photopolymer layer is sensitive and having a thickness which is no greater than one tenth of the thickness of the photopolymer layer and is sufficient to substantially prevent light from the source from being reflected by the surface of the wafer to the photopolymer layer, developing the photopolymer layer to form a sandblast mask, and sandblasting the wafer through the sandblast mask.

6. A method of processing a wafer as recited in claim 5 comprising the step of exposing the photopolymer layer to a source of light after the developing step to obtain a good adhesion between the photopolymer layer and the colored layer.

7. A method of processing a wafer as recited in claim 5 comprising the step of removing the colored layer by sandblasting.

8. A method of processing a wafer as recited in claim 5 wherein the wafer is cut into pellets during the sandblasting step and wherein during the step of exposing the photopolymer layer to a source of light the exposure is through a photomask whose light-transmitting areas have a minimum dimension which is greater than or equal to one fifth the thickness of the wafer.

* * * * *